（12） United States Patent
Chowdhury

(10) Patent No.: US 7,454,730 B1
(45) Date of Patent: Nov. 18, 2008

(54) REPEATER INSERTION FOR CONCURRENT SETUP TIME AND HOLD TIME VIOLATIONS

(75) Inventor: Salim U. Chowdhury, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 342 days.

(21) Appl. No.: 11/293,058

(22) Filed: Dec. 2, 2005

(51) Int. Cl.
*G06F 17/50* (2006.01)
(52) U.S. Cl. ........................................................ 716/6
(58) Field of Classification Search ...................... 716/4, 716/6, 10, 18
See application file for complete search history.

(56) References Cited

U.S. PATENT DOCUMENTS

| | | | |
|---|---|---|---|
| 6,353,917 B1 * | 3/2002 | Muddu et al. .................... | 716/6 |
| 6,493,854 B1 * | 12/2002 | Chowdhury et al. ............ | 716/6 |
| 6,718,523 B2 * | 4/2004 | Hathaway et al. ............... | 716/4 |
| 6,760,893 B2 * | 7/2004 | Stong .............................. | 716/6 |
| 6,807,658 B2 * | 10/2004 | Mielke et al. ................... | 716/6 |
| 7,092,838 B1 * | 8/2006 | Srinivas et al. ............... | 702/117 |
| 2003/0009733 A1 * | 1/2003 | Hathaway et al. ............... | 716/6 |

* cited by examiner

*Primary Examiner*—Stacy A Whitmore
(74) *Attorney, Agent, or Firm*—Martine Penilla & Gencarella LLP

(57) ABSTRACT

A method for inserting repeaters into an integrated circuit synthesis is provided. The method initiates with identifying possible repeater insertion locations along a signal routing pathway within an integrated circuit design. The possible repeater insertion locations are organized in a tree enabling bottom-up traversal. A set of solutions for each of the insertion locations is generated while traversing the tree in a first direction and the set of solutions is organized in a first and a second set, the first set ordered by a late mode capacitive load and the second set order by an early mode capacitive load. A computer readable medium including program instructions representing the method operations and a system are also included.

21 Claims, 13 Drawing Sheets

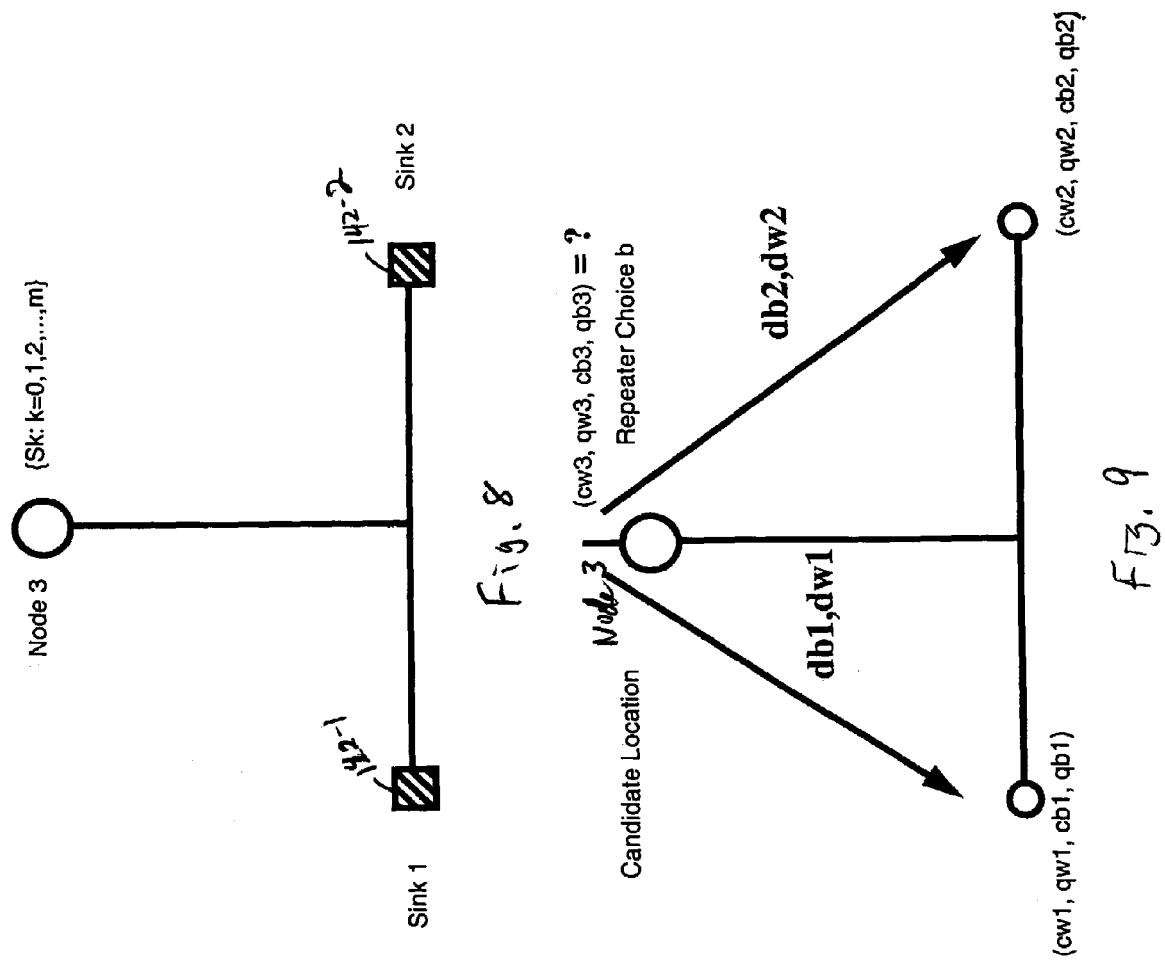

US 7,454,730 B1

REPEATER INSERTION FOR CONCURRENT SETUP TIME AND HOLD TIME VIOLATIONS

BACKGROUND

In circuit design applications, repeaters, which can be inverting or non-inverting, along the interconnects within an integrated circuit (IC) network are inserted to reduce the interconnect delays to eliminate cycle (setup) time violations at the worst process corner. Traditionally, an initial timing at the worst process corner indicates the networks (nets) with setup time violations. Repeater insertion in those nets alleviates the setup time violations. A second timing at the best process corner is performed to identify the so-called fast paths with hold time violations. However, at the best process corner, timing in some paths in the IC network could be too fast giving rise to hold time violations. Special repeaters are then inserted to adequately increase the timing delays in the paths with hold time violations. One shortcoming of this two-step process is that the repeater insertion to reduce the timing delays in the first step is done without any consideration of the hold time violations and therefore can increase the number of nets with hold time violations. It should be appreciated that the first timing step at the worst process corner and the second timing step at the best process corner may be referred to as late timing mode and early timing mode, respectively.

For example, it is possible to have a sink, i.e., a destination, with a setup time violation at the worst process corner and a hold time violation at the best process corner. Thus, when attempting to reduce timing delays in the late mode without consideration of the early mode, a non-optimal solution that may adversely impact early mode timing as well as introduce extra repeaters may result. In such a scenario, the outcome of repeater insertion in the late-mode will be compromised with the repeater insertion in the early-mode.

Therefore, it is necessary to provide a repeater solution that alleviates setup time violations (late mode timing violations) and also alleviates hold time violations (early mode timing violations) at the same time.

SUMMARY

Broadly speaking, the present invention fills these needs by providing a methodology for extending methods for repeater insertion for setup time violation to concurrently deal with both setup and hold time violations. It should be appreciated that the present invention can be implemented in numerous ways, including as a process, an apparatus, a system, or a computer readable media. Several inventive embodiments of the present invention are described below.

In one embodiment, a method for inserting repeaters into an integrated circuit synthesis is provided. The method initiates with identifying possible repeater insertion locations along a signal routing pathway within an integrated circuit design. The possible repeater insertion locations are organized in a tree enabling bottom-up traversal. A set of solutions for each of the insertion locations is generated while traversing the tree in a first direction and the set of solutions is organized in a first and a second set, the first set ordered by a late mode capacitive load and the second set order by an early mode capacitive load.

In another embodiment, a computer readable medium having program instructions for inserting repeaters into an integrated circuit synthesis is provided. The computer readable medium includes program instructions for identifying possible repeater insertion locations along a signal routing pathway within an integrated circuit design and program instructions for organizing the possible repeater insertion locations in a tree enabling bottom-up traversal. Program instructions for generating a set of solutions for each of the insertion locations while traversing the tree in a first direction are provided. Program instructions for organizing the set of solutions in a first and a second set are included. The first set is ordered by a late mode capacitive load and the second set is ordered by an early mode capacitive load.

In yet another embodiment, a system for designing an integrated circuit is provided. The system includes a bus, a memory, and a monitor configured to display a design of the integrated circuit. A processor in communication with the memory and the monitor through the bus is included. The processor is operable to receive instructions which, when executed by the processor, cause the processor to identify possible repeater insertion locations along a signal routing pathway within an integrated circuit design; organize the possible repeater insertion locations in a tree enabling bottom-up traversal; generate a set of solutions for each of the insertion locations while traversing the tree in a first direction; and organize the set of solutions in a first and a second set, wherein the first set ordered by a late mode capacitive load and the second set order by an early mode capacitive load.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIG. 8 is a simplified schematic diagram demonstrating the solution generation at a candidate location close to a sink node in accordance with one embodiment of the invention.

FIG. 9 shows the generation of slew feasible solutions discussed in FIG. 8 and the computed delay values in more detail.

DETAILED DESCRIPTION

The embodiments described herein provide a methodology for extending methods for repeater insertion for setup time violation to concurrently deal with both setup and hold time violations. It will be apparent to those skilled in the art that the present invention may be practiced without some or all of the specific details set forth herein.

The embodiments described herein provide a scheme for inserting repeaters and concurrently considering the early mode timing and the late mode timing. The best solution with the minimum late-mode delay, that also eliminates the hold-time violation, can only be obtained by considering the setup-time violation and the hold-time violation concurrently. The repeater can contribute toward alleviating both setup time violation and hold time violation. Also, a single repeater could alleviate violations at multiple sinks as described in more detail below, thereby minimizing the number of repeaters. These interactions are naturally addressed to remove both violations with the minimum number of repeaters when violations are addressed concurrently as described in more detail below.

Figure 1:
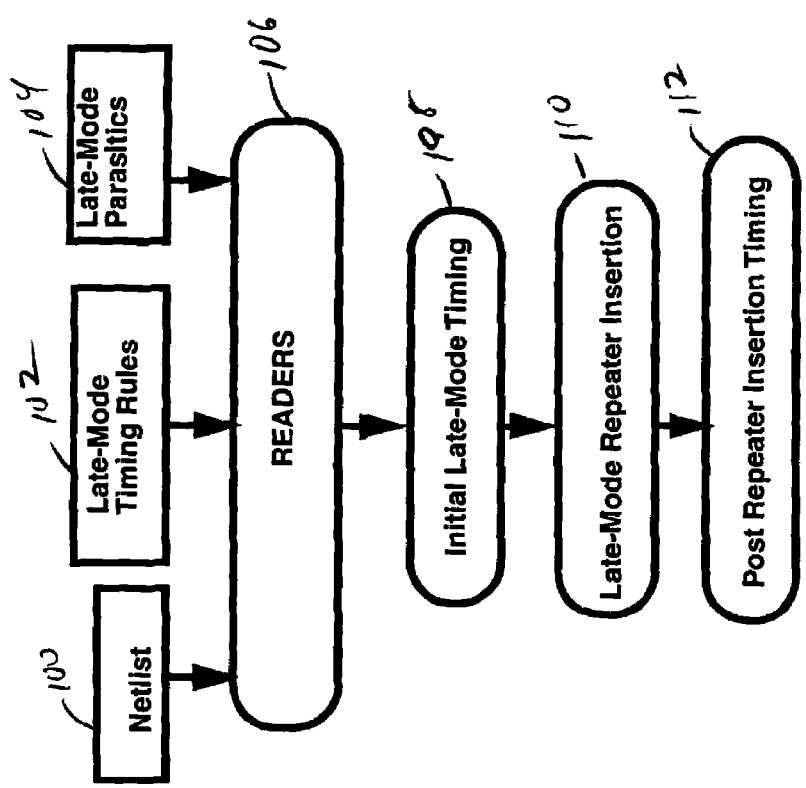
FIG. 1 is a simplified flowchart diagram illustrating the traditional methodology for inserting repeaters for setup (late-mode) time violations.

FIG. 1 is a simplified flowchart diagram illustrating the traditional methodology for inserting repeaters for setup (late-mode) time violations. Netlist 100, late mode timing rules 102, and late mode parasitics 104 are provided to readers 106. Initial late mode timing is generated in operation 108, followed by late mode repeater insertion in operation 110. Thereafter, in operation 112, post repeater insertion timing is performed. As mentioned above, the late mode repeater insertion may result in early mode violations, which then have to be corrected in the post repeater insertion timing.

Figure 2:
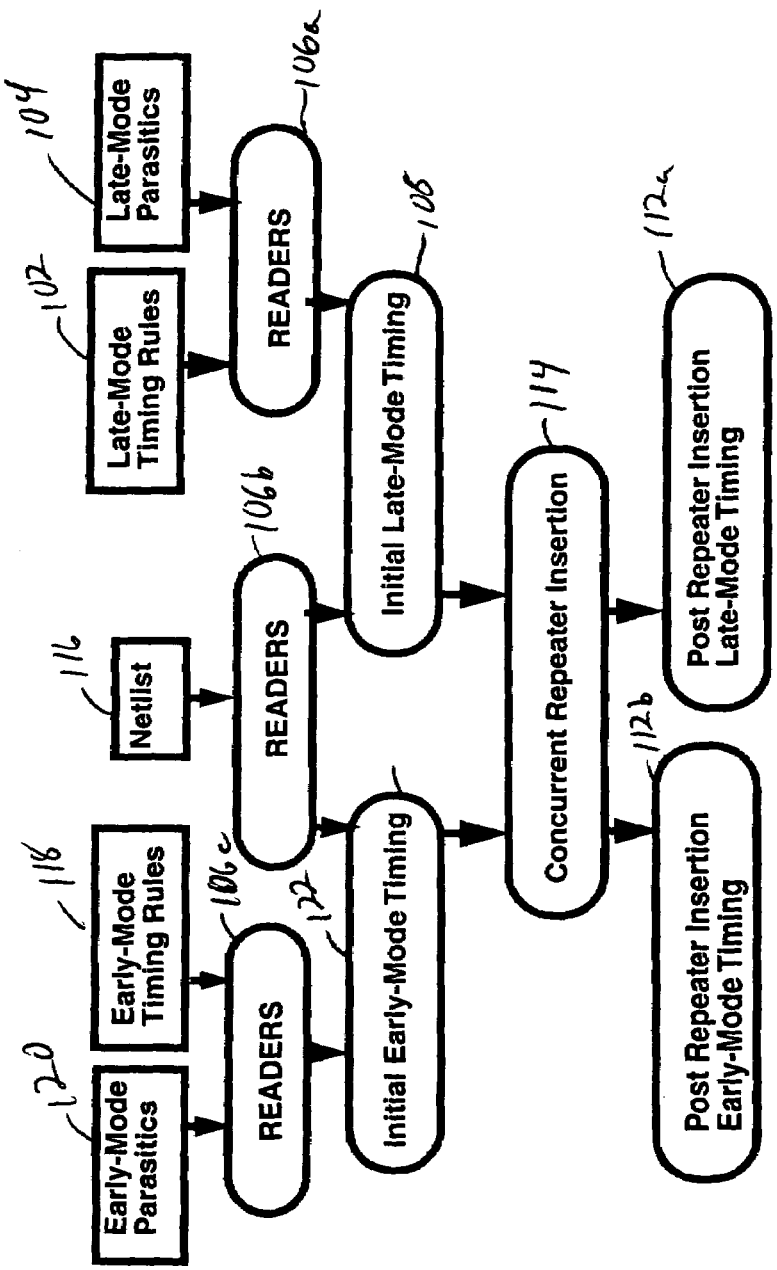
FIG. 2 illustrates a framework for concurrently performing repeater insertion based upon both late mode and early mode timing information, in accordance with one embodiment of the invention.

FIG. 2 illustrates a framework for concurrently performing repeater insertion based upon both late mode and early mode timing information, in accordance with one embodiment of the invention. In this embodiment, two sets of timing rules are provided to corresponding readers 106a and 106c; (a) the late-mode timing rules for cells (logic gates) at the worst process corner 102 and (b) the early-mode timing rules for cells at the best process corner 118. Similarly, two sets of parasitics for interconnects 104 and 120, which may also be referred to as detailed standard parasitic format (dspf), are supplied, one for the worst process corner (for late mode timing) and one for the best process corner (for early-mode timing). Netlist 116 is provided to reader 106b. Initial early mode timing 122 and initial late mode timing 108 are then generated, which enables concurrent repeater insertion 114. Post repeater insertion for late mode timing 112a and early mode timing 112b are then performed.

In the late-mode context, the timing analysis is performed with the late-mode timing rules for the cells and the late-mode dspf for the interconnects. In the early-mode context, the timing analysis is performed with the early-mode timing rules for the cells and the early-mode dspf for the interconnects. The repeater insertion methodology inserts available repeaters, which may be defined through a repeater library for fixing setup time and hold time violations, to alleviate setup and hold time violations concurrently as specified in operation 114.

In one embodiment, a static timer constructs a directed acyclic graph (DAG) using the gates/cells in a design and the logical connections among them. In this embodiment, the static timer then computes the cell-delays and interconnect delays using known methods and using the gate/cell timing models and the interconnect dspf. The DAG usually starts from originating storage elements, e.g., flip-flops, and ends in destination flip-flops. The outcome of the static timer usually is a timing report with slack numbers in timing paths that starts at the originating flip-flops and ends at the destination flip-flops. In one embodiment, a budgeting tool is used to distribute late-mode-timing slacks and early-mode-timing slacks from multi-net-timing paths to individual nets. This process of slack distribution facilitates optimizing the designing net-by-net instead of considering the complete DAG altogether. One exemplary budgeting tool that may be used in conjunction with the embodiments described herein is further described in "Delay budgeting for a timing-closure driven design method," Kuo, Chien-Chu; Wu Allen C. H., International Conference on Computer Aided Design, 2000, which is incorporated herein in its entirety for all purposes. The outcome of this budgeting process is to determine a required early-mode arrival time $q_{bd}$, at the input of a driver. It should be noted that a driver for a net is also a sink for a different net in the preceding stage.

As focus in the past has been centered around minimizing interconnect delays to meet cycle (setup) time, certain timing paths in an IC network are fast enough to violate the hold time requirements giving rise to what is called a race condition. Timing in these fast paths needs to be increased in order that the hold-time constraints are not violated. For reliability purposes, slow paths are identified using the worst-case process corners for timing (in terms of resistance (R) and capacitance (C) of the interconnects and gate/repeater delay models) and fast paths are identified in terms of the best-case process corner. In a typical design flow, first, the slow timing paths are improved via repeater insertion and other techniques to meet setup time. Next, a timing analysis is performed to identify the fast paths and repair them by inserting specialized repeaters close to the sinks (destination point). As mentioned above, the identification of the slow paths is referred to as the late-mode timing analysis and the identification of the fast paths is referred to as the early-mode timing analysis.

Figure 3:
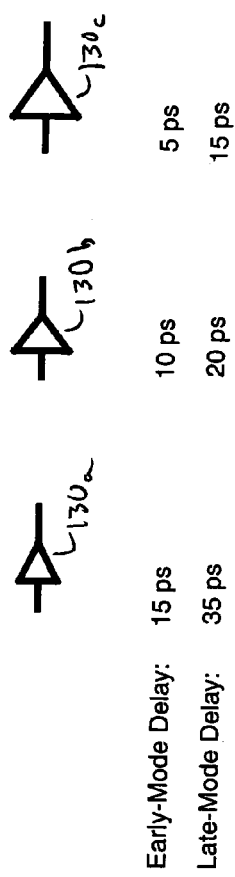
FIG. 3 illustrates three available repeater types available with slow-mode and fast-mode delays.
Figure 4:
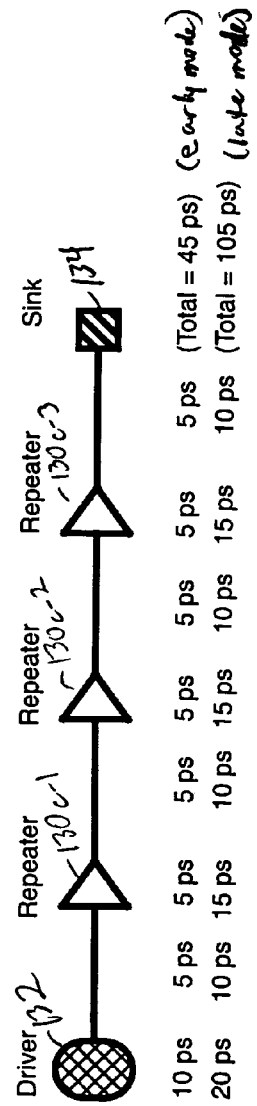
FIG. 4 illustrates a repeater insertion to alleviate late mode timing issues, without considering the early mode.
Figure 5:
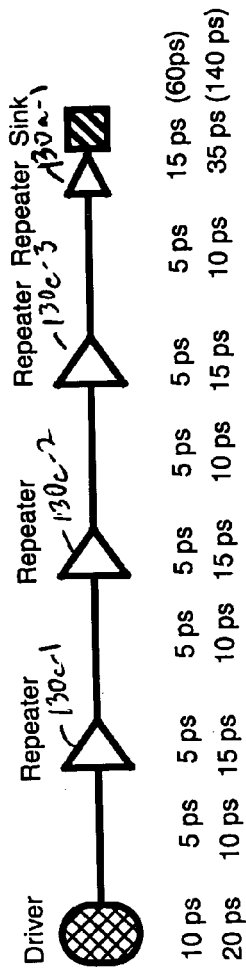
FIG. 5 is a simplified schematic diagram illustrating a fourth repeater added to the net of FIG. 4 in order to accommodate the early mode.

As referenced above, these two isolated repeater insertion steps, one for the late mode and the other for the early mode, may interact in conflicting ways. FIGS. 3-5 provide an example of the conflicting interaction between the late and early mode repeater insertion steps. For example, consider a point-to-point net with a required sink arrival time of 120 pico-seconds (ps) in the late mode (assume that the signal starts at zero time at the input of the source) and 60 ps required arrival time in the early mode. FIG. 3 illustrates three available repeater types 130a-c, available with slow-mode and fast-mode delays. Thus, repeater 130a has an early mode delay of 15 ps and a late mode delay of 35 ps, and so on.

FIG. 4 illustrates a repeater insertion to alleviate late mode timing issues, without considering the early mode. Here, three repeater 130-1 through 130-3, all of the same size are inserted in the given net defined between driver 132 and sink 134. The timing results (both late and early mode) are illustrated in total and for each contributing factor. As illustrated, the delay for the interconnect segment is listed as 5 ps for the early mode and 10 ps for the late mode. Driver 132 contributes a 10 ps delay in the early mode and a 20 ps delay in the late mode. As indicated by the total delay this solution achieves a better than expected delay improvement in the late mode, 105 ps vs. 120, however, the required arrival time of 60 ps is violated in the early mode as the signal arrives at 45 ps.

FIG. 5 is a simplified schematic diagram illustrating a fourth repeater added to the net of FIG. 4 in order to accommodate the early mode. Here repeater 130a-1 is added to the net with 130c-1 through 130c-3. It should be noted that the addition of repeater 130a-1 adds 15 ps to the early mode to bring the timing up to the required minimum of the early mode. However, now adds an additional 35 ps in the late mode timing of this net, violating the maximum cycle time requirement of 120 ps. The conflicting interactions of sequentially processing the early and late modes results in this type of interaction, which adds to the labor and time of chip design.

Figure 6:
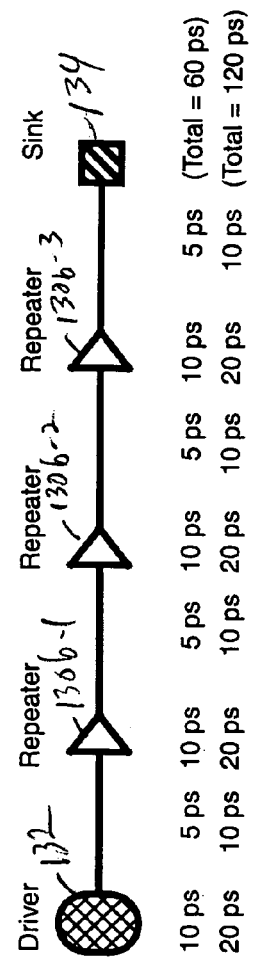
FIG. 6 illustrates a solution to the net of FIG. 4 considering the early and late mode requirements concurrently in accordance with one embodiment of the invention.

FIG. 6 illustrates a solution to the net of FIG. 3 considering the early and late mode requirements concurrently in accordance with one embodiment of the invention. Here, repeaters 130b-1 through 130b-3 have been inserted between driver 132 and sink 134. This solution meets the early mode timing requirement and at the same time satisfies the late mode timing requirement. As described in more detail below, it is possible to discover this solution if the above two repeater insertion steps are combined into a single repeater insertion step, which concurrently attempts alleviating the late-mode and the early-mode timing violations. In this concurrent late-mode and early-mode repeater insertion methodology, the early mode signal arrival time is taken as a constraint. The late mode signal arrival time is minimized subject to the early mode signal arrival time constraint. The embodiments define candidate locations in a tree form and perform a bottom-up traversal of the tree containing the candidate locations where the repeaters are inserted as nodes in the tree. In one embodiment, the solutions are generated at the leaf level of the tree. Where two solutions are possible, the technique described herein compares the two solutions to detect a sub-optimal solution that may be discarded. As the amount of nets within the complicated integrated circuits currently produced is very large, this pruning of sub-optimal solutions prevents the data from becoming excessive thereby controlling the growth of run time and memory space.

Figure 7:
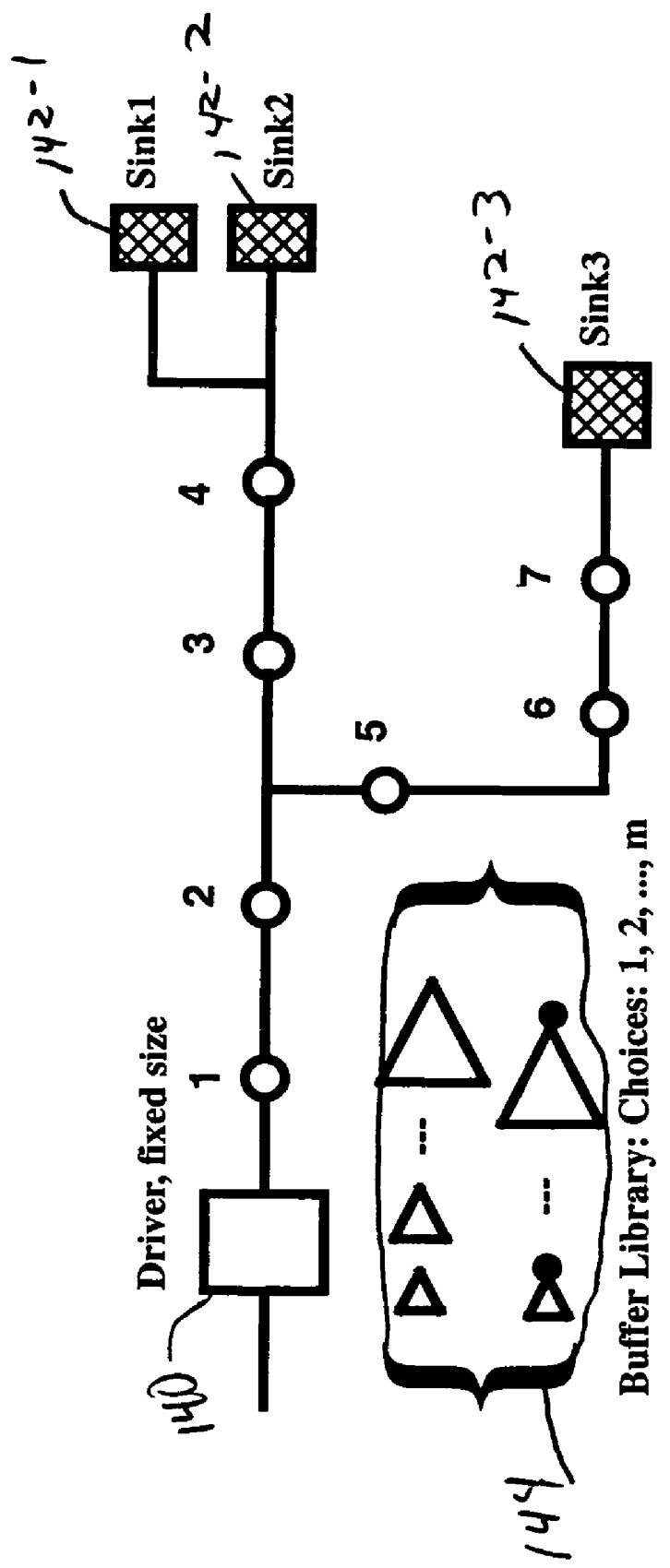
FIG. 7 is a simplified schematic diagram illustrating candidate locations located on a RC tree network for a net being processed concurrently with regard to early and late timing modes in accordance with one embodiment of the invention.

FIG. 7 is a simplified schematic diagram illustrating candidate locations located on a RC tree network for a net being processed concurrently with regard to early and late timing modes in accordance with one embodiment of the invention. At a given candidate locations, let the choices be:

(I) 0: place nothing, and
(II) 1-m: place a repeater, size (1, 2, . . . , m)

All these choices give rise to what is called "partial" solutions at a candidate location. As used herein, the term "solution" may refer to a partial solution, and use the term "final solution" may refer to the solution of the whole net. The net defined through FIG. 7 includes candidate locations 1-7 between driver 140 and sinks 142-1 through 142-3. Repeaters available for insertion at candidate locations 1-7 are provided in library 144. It should be appreciated that the repeaters within library 144 may be inverting or non-inverting. As mentioned above, in the bottom-up process, the number of solutions usually grows when moving from the sinks to the driver. Pruning sub-optimal solutions controls the growth of these solutions. The embodiments described herein extend the use of timings from consideration of the late mode to consideration of the late and early modes to more efficiently provided repeaters to address timing issues during chip design.

A solution is presented by a (c, q) pair, where c is the capacitive load and q is the required arrival time. The capacitive load for repeaters, sinks, and/or the interconnect can be different in the early mode compared to the late mode. Similarly, the timing model for a gate/repeater and the interconnect resistance can be different under the two process corners. Thus, for each choice of placing a repeater at a candidate location, two pairs $(c_w, q_w)$ and $(c_b, q_b)$ are computed. The two pairs represent, respectively, the worst-case (late-mode) and the best-case (early-mode) capacitive load and the required arrival times.

Any of the above choices giving rise to a solution, therefore, will be represented by a set of two pairs:

$$\{(c_w, q_w), (c_b, q_b)\}$$

where $c_w$ is the late-mode (or worst process corner) capacitive load for this solution, $c_b$ is the early-mode (or the best process corner) capacitive load, $q_w$ is the late-mode required arrival time at the candidate location, and $q_b$ is the early-mode required arrival time.

One skilled in the art will appreciate that the solution may be represented as a combination of four numbers:

$$(c_w, q_w, c_b, q_b)$$

The bottom-up process essentially consists of first processing a candidate location close to one or more sinks 142-1 through 142-3, and next repeating the process for a candidate location which is in the immediate up-stream of already processed candidate locations. For example, with respect to the candidate locations in FIG. 7, an acceptable order of processing the candidate locations is 4-3-7-6-5-2-1 (and finally the driver). Thus, it is enough to illustrate the generation and pruning method, first, at a candidate location that has two sink children and next, at a candidate location which has two children that are also candidate locations. One skilled in the art will appreciate that generalization to one child or more than two children, or a combination of sink children and candidate-location children is apparent.

Figure 15:
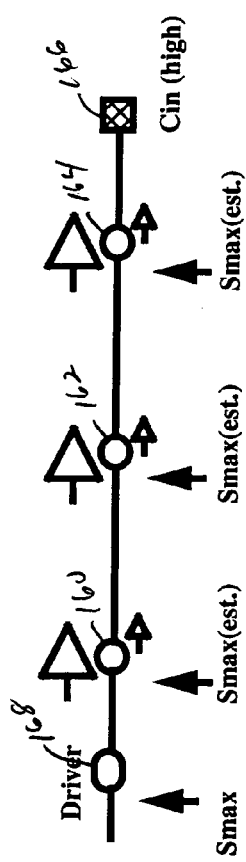
FIG. 15 is a simplified schematic illustrating the location of candidates and the assumption of the max slew during the bottom-up traversal in accordance with one embodiment of the invention.

The embodiments initially locate a minimum and adequate set of candidate locations along RC segments in the RC network as further discussed with reference to FIGS. 15 and 16. The candidate locations are ordered for bottom-up traversal of the RC network, i.e., sinks are at the bottom and the driver is at the top. A suitable candidate location to start is then selected. At the candidate location selected, "slew feasible" (partial) solutions are generated (given by a four-tuple ($c_w$, $q_w$, $c_b$, $q_b$)) by trying each repeater from the given list of repeaters. Solutions that can be detected as being sub-optimal are discarded. Each solution is inserted into two lists: one of the lists is sorted in ascending order of $c_b$, the other list is sorted in ascending order or $c_w$. As will be explained later the two lists are ordered for the concurrent processing of the late mode and the early mode, respectively. For the candidate location being visited, the generated solutions are inspected to prune solutions, which are sub-optimal as dictated by a set of rules listed in Table 1. Generating "slew feasible" solutions and the pruning is repeated for each of the other candidate locations in the bottom-up traversal. When there are no more candidate locations to be processed, i.e., the driver has been reached, the driver is now processed and "slew feasible" (a partial) solutions (given by a four-tuple ($c_w$, $q_w$, $c_b$, $q_b$)) are generated. Here again, solutions which can be detected to be sub-optimal are discarded or not considered. Then at the driver, the solution associated with $S_{best}$, i.e. the solution with the highest $q_w$ among all the solutions with $q_b \leq q_{bd}$ (the required arrival time in the early mode at the input of the driver). The solutions at the immediate downstream candidate locations to the driver that give rise to $S_{best}$ are identified. The repeater type dictated by the identified solution(s) is the outcome at the candidate location(s) and the above-described method of operations are applied recursively to identify the repeater type at each down steam candidate location. Thereafter, the integrated circuit is designed using the repeater types at the candidate locations obtained above.

FIG. 8 is a simplified schematic diagram demonstrating the solution generation at a candidate location close to a sink node in accordance with one embodiment of the invention. Assuming the solution at sink 1 142-1 is ($c_{w1}$, $q_{w1}$, $c_{b1}$, $q_{b1}$) where $c_{w1}$ is the input capacitance at sink 1 for the late-mode analysis and $c_{b1}$ being the corresponding number for the early-mode analysis; $w_{q1}$ is the required arrival time at sink 1 142-1 for the late mode timing and $q_{b1}$ being the corresponding number for the early-mode timing. Similarly, the solution at sink 2 142-2 is ($c_{w2}$, $q_{w2}$, $c_{b2}$, $q_{b2}$).

To construct the solution k (corresponding to the choice of repeaters) at node 3, two sets of delays ($d_{w1}$, $d_{b1}$) and ($d_{w2}$, $d_{b2}$), respectively, the delays to sink 1 142-1 and sink 2 142-2 from node 3, are computed. It should be noted that the subscript w signifies the late mode and the subscript b signifies the early mode. The components ($c_{wk}$, $q_{wk}$) may be defined as $c_{wk}$ being the input capacitance and $q_{wk}$=min($q_{w1}$−$d_{w1}$, $q_{w2}$−$d_{w2}$). The component $c_{bk}$ is also computed following the same method. However, the component $q_{bk}$=max($q_{b1}$−$d_{b1}$, $q_{b2}$−$d_{b2}$). If the signal arrives at node 3 any time sooner than $q_{bk}$, it will violate the early mode arrival time requirement at one of the sinks, and that is why the max function is used instead of the min function, which is used in the late mode. Accordingly the embodiments described herein consider the early mode and apply this constraint to compute where to insert repeaters along the net.

FIG. 9 shows the generation of slew feasible solutions discussed in FIG. 8 and the computed delay values in more detail. The following operations in TABLE A further defines the generation of slew feasible solutions:

TABLE A a. use RC network for late-mode timing.
b. use late-mode timing model.
c. compute $d_{w1}$ and $d_{w2}$.
d. compute $c_{w3}$ (input capacitance for buffer choice b in the late-mode).
e. compute $q_{w3}$ = min ($q_{w1}$ − $d_{w1}$, $q_{w2}$ − $d_{w2}$).
f. repeat steps a-d for early mode to compute $d_{b1}$ and $d_{b2}$, and $c_{b3}$. Use RC values for early mode and timing models in early mode.
g. compute $q_{b3}$ = max ($q_{b1}$ − $d_{b1}$, $q_{b2}$ − $d_{b2}$).

It should be appreciated that application of the above process for (m+1) choices at node 3 will give rise to (m+1) solutions at node 3, some of which may be sub-optimal, and hence requires pruning. Identification of sub-optimal solutions will be discussed in more detail below.

One skilled in the art will appreciate that an inserted repeater isolates a network into two sub-networks. The repeater acts as a driver for the downstream sub-network rooted at the repeater. The drive strength of the repeater determines its comparative value as per driving the downstream sub-net-work is concerned. The repeater also acts as a load for the upstream sub-network. For the upstream sub-network, the relative value of a repeater is dictated by its input capacitance. A larger repeater in size may include acceptable drive strength for the downstream sub-network, but the larger repeater may provide too much load for the upstream sub-network. Similarly, a small repeater may provide a weak drive strength for the downstream sub-network, but may provides less load for the upstream sub-network. In addition, the intrinsic delays through the repeaters are usually different for different repeaters.

When dealing solely with the late mode, the objective of repeater insertion is to minimize the delay (in the late mode) in the critical path (among all destinations/sinks). This objective correlates to maximizing the required arrival time q. Thus, if there are two solutions having (c, q) pairs given by ($c_{w1}$, $q_{w1}$) and ($c_{w2}$, $q_{w2}$), respectively, then, if ($c_{w2}$>$c_{w1}$), but ($q_{w2} \leq q_{w1}$), the solution having ($c_{w2}$, $q_{w2}$) values can be deleted for being sub-optimal. This is because the solution proves to be disadvantageous for the downstream sub-network (less q) and also disadvantageous for the upstream sub-network (high c).

As far as the late mode is concerned, this pruning can be accomplished in a linear scan of the solutions if the solutions are pre-arranged in an ascending order of c. In one embodiment, the solutions are inserted in ascending order of c, thus, avoiding sorting them after all the solutions are generated. It should be appreciated that the pruning of the solutions restricts the number of solutions from building up very quickly as the bottom-up method continues from the sinks toward the driver. Thus, while the number of solutions to be generated at node 3 in FIG. 9 is m+1, some of these solutions may be pruned.

As mentioned above, the prior techniques do not guarantee satisfying the early-mode timing constraint. In contrast, under the technique described herein, where two solutions s1 and s2 having early-mode components as ($c_{b1}$, $q_{b1}$) and ($c_{b2}$, $q_{b2}$), respectively, and corresponding late-mode components, respectively, ($c_{w1}$, $q_{w1}$) and ($c_{w2}$, $q_{w2}$), it is assumed that the required arrival time for the signal in the early mode at the driver location will be $q_{bd}$. For a timing path encompassing multiple nets, $q_{bd}$ values at the drivers are to be arrived at using a slack distribution method as discussed with reference to the article entitled "Delay budgeting for a timing-closure driven design method," which has been previously incorporated. The closer the $q_b$ value of a solution is to $q_{bd}$ the better is the chance of satisfying the early-mode constraint for that solution. Therefore, as early mode is concerned, a solution having a lower value of $q_b$ is preferred. A solution having a higher $c_b$ has the potential to minimize $q_b$ at an up-stream candidate location. Consequently, it becomes possible to declare $(c_{b1}, q_{b1})$ sub-optimal as compared to $(c_{b2}, q_{b2})$ if $(c_{b1} < c_{b2})$ and $(q_{b1} \geqq q_{b2})$.

It is to be noted that a solution having a $q_b$ less than $q_{bd}$ cannot be pruned automatically. During the bottom-up procedure, the solutions that are stemming from this solution may have a still lower value of $q_b$, however, if this solution is pruned, there may exist no other solution that will satisfy the early-mode constraint. In case there does exist such an additional solution, then this other solution can be pruned. Thus, if there are two solutions $(c_{b1}, q_{b1})$ and $(c_{b2}, q_{b2})$ with $q_{b1} \leqq q_{bd}$, $q_{b2} \leqq q_{bd}$, then one of these two solutions, if it is sub-optimal in the late-mode, even if not sub-optimal in the early-mode, may be pruned. In other words, out of all solutions that already satisfy the early-mode constraint, at least one of these solutions is retained. When the driver is reached during the bottom-up method, among all solutions that satisfy the early-mode constraint, the best solution with the minimum $q_w$ is retained. Thus, the following distinct cases have been identified and are summarized in Table 1. It should be appreciated that $c_{w2} \geqq c_{w1}$ in all these cases.

TABLE 1

Case I: $q_{b1} > q_{bd}$ and $q_{b2} \leqq q_{bd}$: No pruning possible if $(c_{w1} < c_{w2})$. If $(c_{w1} = c_{w2})$ and $(q_{w1} \leqq q_{w2})$ then s1 can be pruned.
Case II: $q_{b1} > q_{bd}$ and $q_{b2} > q_{bd}$: if $(q_{w2} \leqq q_{w1})$, $(c_{b2} \leqq c_{b1})$ and $(q_{b2} \geqq q_{b1})$ then s2 can be pruned. If $(q_{w1} \leqq q_{w2})$, $(c_{w1} = c_{w2})$, $(c_{b1} \leqq c_{b2})$ and $(q_{b1} \geqq q_{b2})$ then s1 can be pruned.
Case III: $q_{b1} \leqq q_{bd}$ and $q_{b2} \leqq q_{bd}$: If $(q_{w2} \geqq q_{w1})$ then s2 can be pruned. If $(c_{w1} = c_{w2})$, and $(q_{w1} \leqq q_{w2})$ then s1 can be pruned.
Case IV: $q_{b1} \leqq q_{bd}$ and $q_{b2} > q_{bd}$: If $(q_{w2} \leqq q_{w1})$ then s2 can be pruned.

Figure 10:
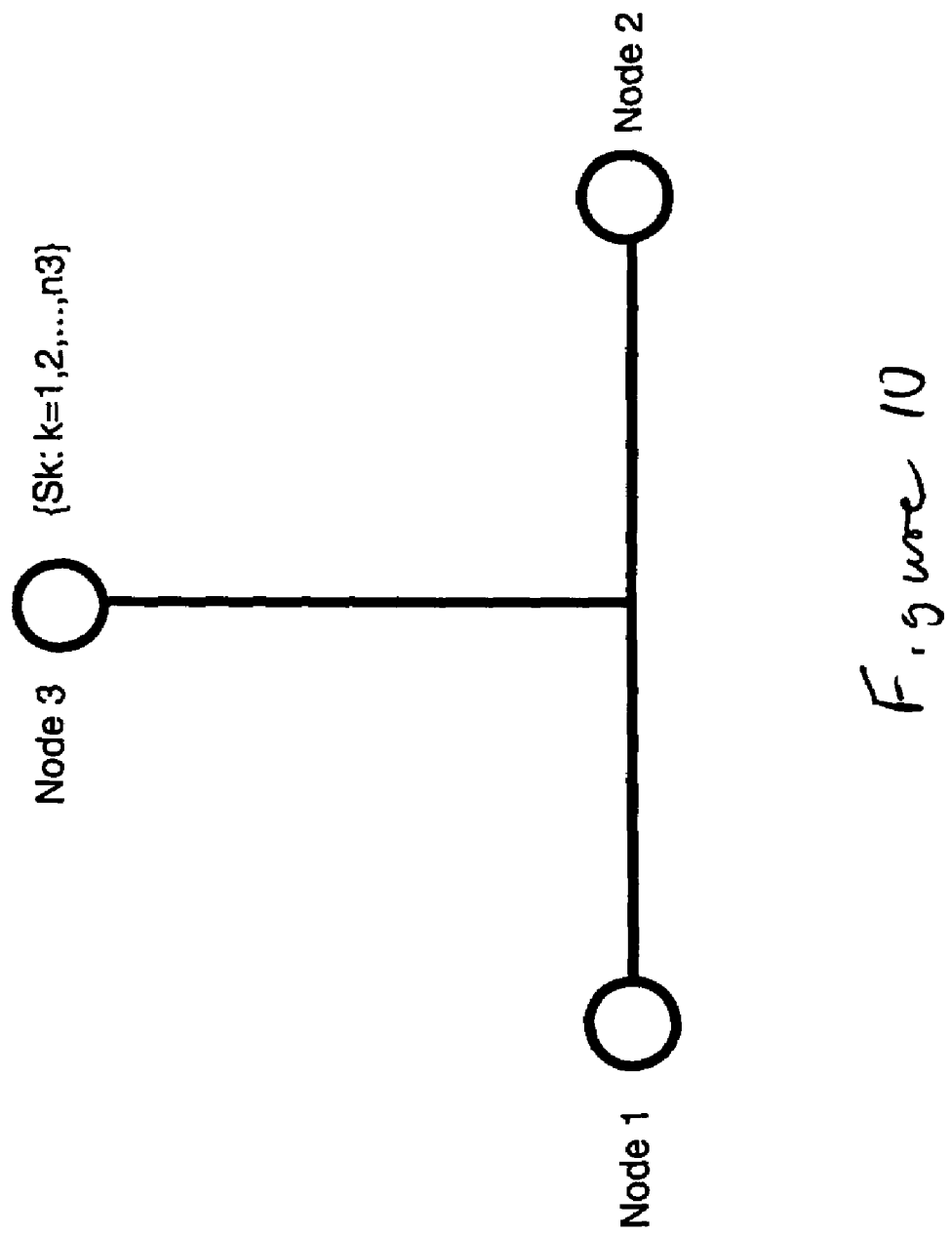
FIG. 10 illustrates a simplified schematic where a candidate location is driving two other candidate locations and the application of the concurrent early and late mode repeater insertion scheme to this configuration in accordance with one embodiment of the invention.

FIG. 10 illustrates a simplified schematic where a candidate location is driving two other candidate locations and the application of the concurrent early and late mode repeater insertion scheme to this configuration in accordance with one embodiment of the invention. For a candidate location at node 3 having two descendants (at note 1 and node 2), also candidate locations, n1 ($\geqq 1$) solutions at node 1 and n2 ($\geqq 1$) solutions at node 2 were previously computed. For any of the (m=1) choices of a repeater at node 3, there are n1*n2 combinations of solutions at the descendent nodes. However, only n1+n2 combinations need o be considered (in the worst case), as far as the late-mode is concerned. The process of advancing through these combinations is out-lined below.

The solutions at nodes 1 and 2 are sorted in ascending orders of $c_w$. Initially, a pointer points to the first solution at node 1 and a second pointer points to the first solution at node 2. For a given repeater choice at node 3, and the combination of solutions i and j pointed to by the two pointers at node 1 and node 2, respectively, the delays $(d_{wij1}, d_{wij2})$ are computed. The $q_{w3}$ value at node 3 is computed from $\min(q_{wi} - d_{wij1}, q_{wj} - d_{wij2})$. The minimum q value dictates which node (node 1 or node 2) is timing critical. Assume that node 1 of FIG. 10 is critical. Then, for any of the combinations (i, g) where g can be (j+1, j+2, . . . n2), node 1 remains critical with increasingly higher delay and lower $q_w$ at node 3 since the load capacitance at node 2 is always increasing as g is increased. Thus, to avoid enumerating all those sub-optimal combinations, the pointer is advanced at the critical node, and the procedure of computing delays and q are repeated. Since at least one of the pointers is advanced at every iteration, the maximum number of iterations possible is n1+n2. The above method for not generating sub-optimal solutions works in the late-mode only, but fails when processing the late mode and the early mode concurrently. The reason is that, for a solution not to be generated, it needs to be sub-optimal in the late-mode as well as in the early mode.

Since the $(c_b, q_b)$ pair in the early mode is, in general different, compared to the $(c_w, q_w)$ pair in the late mode, the solutions sorted in ascending order of $c_w$ may not be in ascending order of $c_b$.

A modified method to consider the early mode concurrently is provided, as outlined below in more detail. This procedure applies for multiple (two or more) downstream locations with more than one solution at least one downstream location. The procedure outlines how to avoid the combination of downstream solutions that definitely will result in sub-optimal solution. Let LS and ES be the sets that contain the combinations that are sub-optimal in the late mode and early mode, respectively. A sub-optimal combination is stored (in an ordered set) along with the (dominating) combination against which it is sub-optimal. In an ordered set (x→y), x is the dominating combination and y is sub-optimal to x. Note that the ordered sets constitute an one-to-many mappings. One combination could dominate more than one combinations. Initially both the sets LS and ES are empty. The following operations in TABLE B are then applied:

TABLE B a. Assume there exist two lists of solutions at each downstream location, one list ($S_w$) already sorted in ascending order of $c_w$ and the other list ($S_b$) already sorted in ascending order of $c_b$.
b. Initialize a pointer at each downstream location to the first solution in $S_w$. For two downstream locations let the pointers be i and j. After this step i = 1 and j = 1.
c. Apply the operations listed in TABLE A to compute a solution at the current candidate location.
d. Capture the current combination (i, j) as (a, b) where a = i and b = j. If location with index i is critical then i is incremented. Similarly for j. Advance pointer (to the right) at each downstream location that is critical in the late-mode timing.
e. Identify the combinations (Sw) that are avoided due to exercising operation d. Merge the ordered set ((a, b) -> Sw) with the set LS.
f. Repeat steps c, d and e until a pointer at a critical node cannot be advanced anymore.
g. Initialize a pointer at each downstream location to the last solution in $S_b$. For two downstream locations i = n1 and j = n2, where n1 is the number of solutions in first location and n2 is the number of solutions in the second locations.
h. Apply the operations listed in TABLE A to compute a solution at the current candidate location, if this combination is not already considered in step c.
i. Capture the current combination (i, j) as (c, d) where c = i and d = j. If the location with index i is critical then decrement i. Similarly for j. Advance pointer (to the left) at each downstream location that is critical in early-mode timing.
j. Identify the combinations (Sb) which are avoided due to exercising step i. Merge the ordered set ((c, d) -> Sb) with the list ES.
k. Repeat steps h, i, and j until a pointer at a critical node cannot be advanced anymore.
l. Identify the uncommon combinations in the two lists LS and ES.
m. Generate solutions for uncommon combinations if not already generated either in steps c or h.

In the above method, first the solutions that are not sub-optimal in the late mode are generated. Next, the solutions that are not sub-optimal in the early mode are generated. However, to avoid generating a solution twice, a list of combinations is stored (of solutions at node 1 and node 2) for which a solution is already generated. Two other sets are also generated. One set LS identifies the combinations of solutions (at node 1 and node 2) that will lead to sub-optimal solutions in the late mode. The other set ES identifies the combination of solutions (again at node 1 and node 2) that will lead to sub-optimal solutions in the early mode. The two lists are then compared to identify the combinations that are common in the two lists. Both sets are now updated by eliminating these common combinations from each of the sets. These two sets are merged to identify combinations for which solutions need to be generated. Identifying common combinations require certain attention. Let LS={(x1→x2)} and ES={x3→x2)}. Although the combination x2 is sub-optimal in both late and early modes, it is not sub-optimal (in early and late mode) with respect to the same solution. It is sub-optimal in late mode with respect to solution x1 and is sub-optimal in early mode with respect to solution x3. Thus x2 is not sub-optimal (overall) and hence x2 is not a common combination that can be eliminated. Common combinations are identified by the common ordered pairs (x→y) which occur both in LS and ES.

Recall that for a solution to be sub-optimal in the early mode, a smaller capacitance c and a large arrival time q is needed. Therefore, a pointer is initially set at the last solution at node 1 and a second pointer at the last solution at node 2. While generating a solution the critical node that dictates the $q_b$ at node 3 is identified. The critical node gives rise to the maximum $q_b$ at node 3. Assume node 1 is the critical node. If the pointer is advanced toward the next solution with lower c at node 2, then the delay from node 2 to node 1 will be reduced and thus, node 1 remains critical with a higher $q_b$ at node 3. Thus, the resulting solution will be sub-optimal in the early mode. Therefore, the pointer is advanced at the critical node in order to avoid combinations that will result in sub-optimal solutions.

The combinations that will lead to sub-optimal solutions will be of the nature {i, (j1:j2)} and {(i1:i2), j}, where i, i1 and i2 are indices in the list of sorted solutions at node 1 and j, j1 and j2 are indices in the list of sorted solutions at node 2. There are two such lists of combinations, LS for the late mode and ES for the early mode. The set P is constructed such that a combination p∈P appear either in LS or ES but not in both. To construct P, LS and ES are organized in the following set of pairs: {(i, Si)}, where in each pair (i,Si), i is a solution at node 1 and Si is a set of solutions at node 2. Also, no two pairs can have the identical left element i. The pairs in LS and ES are ordered in the indices of the left element and let LS={(a, b)→(i, Siw)} and ES={(c, d)→(i, Sib)}. The combination (a, b) represents the dominating combination in late mode and the combination (c, d) represents the dominating combination in the early mode. In constructing P (the uncommon set), the first left element i∈LS is considered initially. If i does not occur in ES as a left element then all combinations (i, Si) will be in P. On the other hand, if i does occur in ES, then (i, Si) (where Si=Siw∪Sib−(Siw∩Sib)) will be in P provided (a,b) is the same combination as (c,d). If (a,b) and (c,d) are not the same combination then all combinations represented by (i, Siw) and (i, Sib) will be in P. Thus, through the use of the pointers and the sets LS and ES the sub-optimal pairs are identified to further restrict the amount of data. It should be appreciated that the culling described above through the use of the pointers is in addition to the culling performed by the conditions listed above in TABLE 1.

Figure 11:
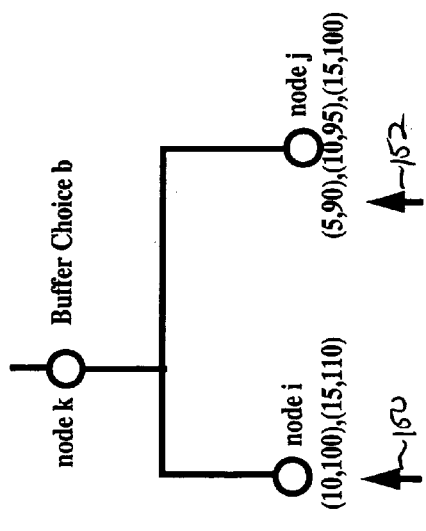
FIG. 11 is a simplified schematic illustrating 2 solutions in the first (left) location (node i) and 3 solutions in the other (right) location (node j), both locations showing late mode solutions only.
Figure 12:
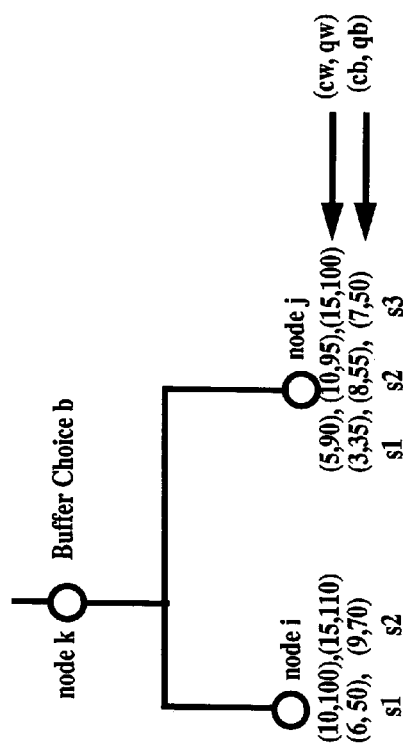
FIG. 12 is a simplified schematic illustrating 2 solutions in the first (left) location (node i) and 3 solutions in the other (right) location (node j), where both locations are showing late mode solutions and early mode solutions.

FIG. 11 is a simplified schematic illustrating 2 solutions in the first (left) location (node i) and 3 solutions in the other (right) location (node j), both locations showing late mode solutions only. Pointers 150 and 152 are initialized at first sets for each of nodes i and j. FIG. 12 is a simplified schematic illustrating 2 solutions in the first (left) location (node i) and 3 solutions in the other (right) location (node j), where both locations are showing late mode solutions and early mode solutions.

Figure 13:
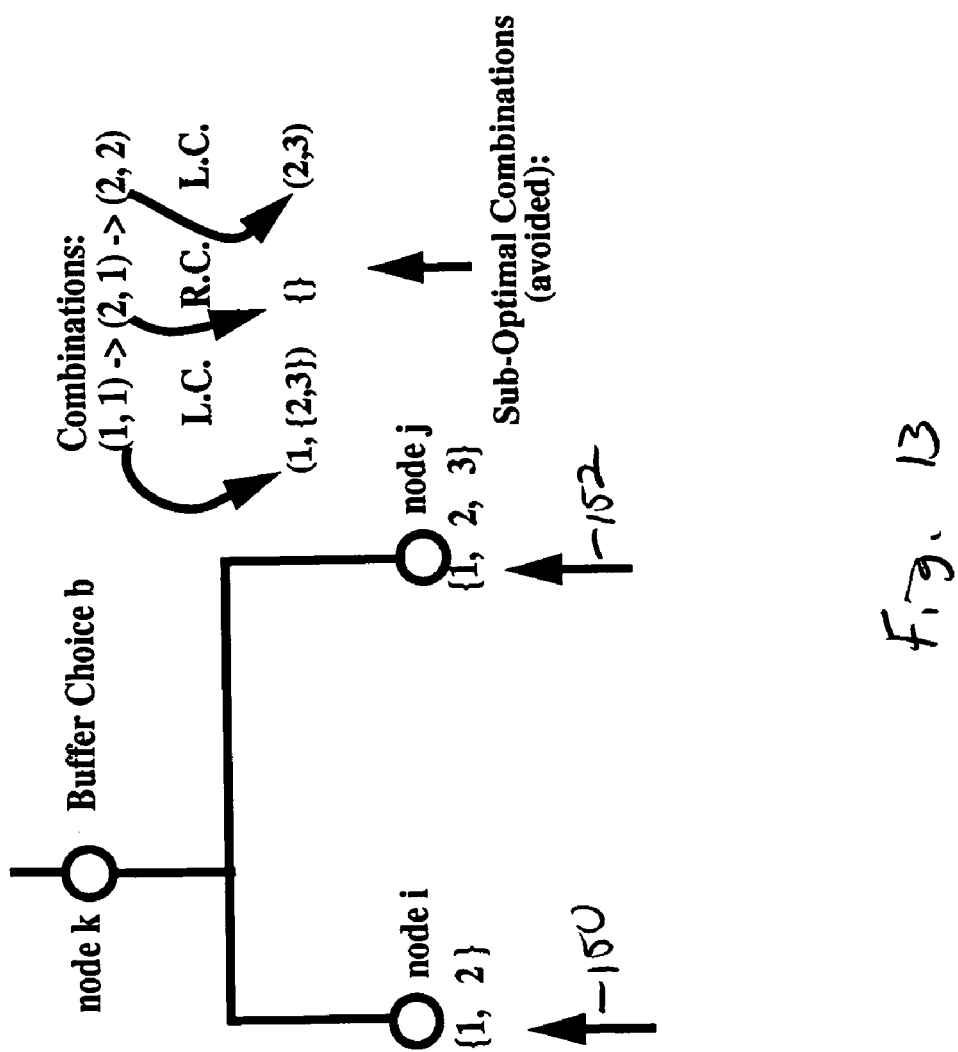
FIG. 13 represents the late mode solutions for each node as a set organized in the order of increasing $c_w$.
Figure 14:
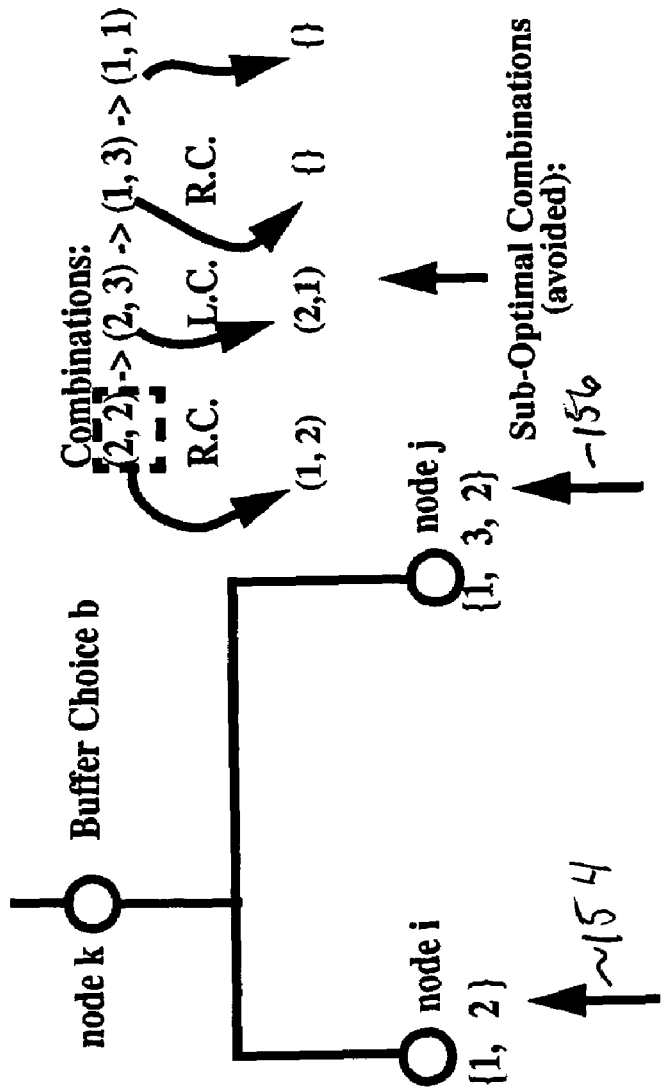
FIG. 14 represents the early mode solutions for each node as a set organized in the order of increasing $c_b$.

FIGS. 13-14 are simplified schematic diagrams illustrating the avoidance of sub-optimal solutions as described above in accordance with one embodiment of the invention. In FIGS. 13-14 there are two downstream candidate locations with 2 solutions in the first (left) location (node i) and 3 solutions in the other (right) location (node j) as specified with regard to FIGS. 11 and 12. It should be appreciated that FIG. 13 represents the late mode solutions for each node as a set organized in the order of increasing $c_w$. FIG. 14 represents the early mode solutions for each node as a set organized in the order of increasing $c_b$.

Initially, the combination (1,1) is considered in the late mode as illustrated by pointers 150 and 152 of FIG. 13. Suppose this combination is left critical (LC) in the late mode and thus pointer 150 at node i is advanced. Notice that by advancing the pointer at node i, the combinations (1,2) and (1,3) are avoided, represented as ((1,1), (1, {2,3})). After pointer 150 is advanced at node i, the combination being considered is (2,1). Suppose that at this combination the new solution generated at node 2 indicates that the (right) node j is critical, i.e., the combination is right critical (RC). (RC). Thus, pointer 152 at node j is advanced. But notice that by advancing pointer 152 at node j, no combinations are avoided because pointer 150 at node i is already at the last solution. Advancement of the solution at node j results in the combination (2,2). Suppose that the new solution constructed at node 3 for this combination shows that it is LC in the late-mode. Pointer 150 at node i is advanced. However, since there is no more solutions at node i, the process is terminated, thereby avoiding the combination (2,3). Set LS is augmented by ((2,2), (2,3)).

Next, the lists of solutions at nodes i and j sorted in $c_b$ are processed in FIG. 14. Note that, the sorting order may be different than the order of sorting in $c_w$. The pointers 154 and 156 are initially at solutions with highest $c_b$, the combination (2,2). However, the solution at node 3 was already generated for the combination (2,2) in the late mode and, thus, this combination is not reconsidered. The computed delays and q values in the early mode are analyzed to ascertain if the combination is LC or RC. Suppose that the combination was LC for the combination (2,2), so the pointer is moved left at node i, resulting in the combination (1,2) and avoiding the combinations (2,3) and (2,1). Thus ES=((2,2), (2, {1,3})). Suppose that at combination (1,2) the computed solution at node 2 indicates that this combination is LC. Pointer 154 is moved to the left at node i, resulting in avoiding the combinations (1, {1,3}). The set ES will be augmented by adding ((1,2), (1, {1,3})).

For this example, LS={((1, 1), (1, {2,3})), ((2,2), (2,3))} and ES={((2,2), (2, {1,3}), ((1,2), (1, {1,3}))}. The set P for uncommon combination is given by P={(1,3), (1,2), (2,1), (1,1), (1,3)}. Solutions for each combination in P are then generated. For this example, solutions are already generated for the combinations (2,1) and (1,1). Solutions need to be generated for combinations (1,3), (1,2) and (1,3). Combinations for multiple (more than two) downstream locations, in general, will have the following form: {(i, {j1:j2}, {k1, k2}, ...}.

The overall method calls for further pruning a list of solutions once they are generated at a candidate location. As mentioned previously, each solution is inserted in two lists, one sorted in $c_w$ and the other sorted in $c_b$. In one embodiment, the procedure for identifying and pruning sub-optimal solutions uses only one list S, the list which is sorted in ascending order of $c_w$. The list S, for the following discussion, is assumed to be a link-list. Thus, every solution (p) has pointers to the previous (p.previous( )) and the next (p.next( )) solutions. When a solution is deleted, the previous and next pointers are adjusted for the affected solutions in the list. S.begin( ) points to the first solution and S.last( ) points to the last solution. The list S will be scanned from left to right (from lower $c_w$ to higher $c_w$). While scanning, a solution will be compared to its next neighbor.

For the case when only late mode is considered, as soon as a sub-optimal solution is encountered, the sub-optimal solution can be deleted. The list S adjusts itself and scanning continues forward. The following pseudo code in Table C represents one exemplary method that can be used to achieve this functionality. It should be appreciated that in this method, the pointer p represents the solution currently being scanned.

TABLE C

```
p = S.begin( );
while (p !=S.last( )  )
{
    compare solutions pointed to by p and p.next( );
    if (p.next( ) is sub-optimal)
        delete p.next( );
    else if (p is sub-optimal)
    {
        temp = p.next( );
        delete p;
        p = temp;
    }
    else increment p;
}
```

The solutions in S are in ascending order of $c_w$. If a solution "b" is being deleted compared to a second solution "a", then "b" has higher (or equal $c_w$) and the same (or less) $q_w$. The solution "b" is immediately deleted, and thus, the solution "a" has the highest $q_w$ in the solutions so far scanned. Therefore, the next solution in S needs to be compared with the solution "a" only, and none of the other solutions that are already scanned.

For the case when late mode and early mode are being considered concurrently, during comparison of a pair of solutions ("a", "b"), one of the solutions can be deleted only when it is sub-optimal (compared to the other solution) in late mode as well as in early mode. Thus, a solution may not be deleted even though it is sub-optimal in late mode, but not in early mode. Consider the case when none of "a" or "b" can be deleted. For the late mode there are three possibilities in this case: (i) "a" is sub-optimal in late mode, (ii) "b" is sub-optimal in late mode and (iii) none of "a" or "b" is sub-optimal in late mode. The next solution in S is "c". The determination to compare "c" with "a" or "b" or both "a" and "b" depends on the $q_w$ values of "a" and "b". If $q_w$ of "a" is less than $q_w$ of "c", there is no need to compare "c" with "a". Therefore, the solutions in S, which are so far scanned, can be stored in a second list G, where the solutions are sorted in ascending order of $q_w$. The solution "a" is stored in G since unlike the late-mode only case, the $q_w$ values for solutions in S (after pruning is complete) may not be in strictly increasing order. The solution "a" (although "a" has lower $q_w$) might have a "good" $q_b$ value indicating that it could be superior in the early mode and the late mode as compared to a solution not yet encountered.

Thus, the general rule is that as soon as a new solution s in S is encountered, its $q_w$ value is noted (assuming it to be $q_{ws}$) and compared with other solutions in G, which have $q_w$ values higher than or equal to $q_{ws}$. This new solution will be added to G if it is not sub-optimal (in both late and early mode) compared to any of the existing solutions in G. The operation G.insert(p) is assumed to insert p in G in ascending order of $q_w$. The procedure for identifying sub-optimal solutions (both in the late mode and the early mode) is as follows in TABLE D.

TABLE D

```
1.  if(s.size( ) == 1)
2.      return;
3.  p = S.begin( );
4.  G = Φ;
5.  while (p != NULL)
    {
6.      if(G == Φ)
7.          G.insert(p); p = p.next( ); continue (go to line 5);
8.      Let x = first solution in G for which qwx ≧ qwp (qw for p);
9.      bool sub-optimal = false;
10.     while (x != NULL && !sub-optimal)
        {
11.         if (p is sub-optimal (compared to x))
            {
12.             temp = p.next( );
13.             delete p;
14.             p = temp;
15.             sub-optimal = true;
            }
16.         x = x.next( );
17.     if (!sub-optimal)
18.         G.insert(p);
19.     p = p.next( );
    }
```

The functionality defined through TABLE D is illustrated with the following exemplary list of 15 solutions in TABLE 2 and the corresponding building of set G n TABLE 3. Note, it is assumed that, for all these 15 solutions, $q_b > q_{bd}$ and thus, only case II of TABLE 1 applies for comparing any two solutions.

TABLE 2

| Solution # | $c_w$ | $q_w$ | $c_b$ | $q_b$ |
|---|---|---|---|---|
| 1 | 10 | 100 | 5 | 50 |
| 2 | 11 | 102 | 6 | 51 |
| 3 | 13 | 101 | 6 | 52 |
| 4 | 15 | 106 | 7 | 52 |
| 5 | 15 | 105 | 8 | 54 |
| 6 | 16 | 104 | 9 | 55 |
| 7 | 17 | 103 | 6 | 55 |
| 8 | 18 | 103 | 8 | 54 |
| 9 | 19 | 109 | 10 | 56 |
| 10 | 20 | 110 | 11 | 57 |
| 11 | 21 | 108 | 12 | 58 |
| 12 | 22 | 109 | 13 | 59 |
| 13 | 22 | 111 | 14 | 60 |
| 14 | 23 | 109 | 9 | 57 |
| 15 | 24 | 110 | 11 | 56 |

TABLE 3

| Current Solution G | Compare Pair | Sub-Optimal Solution | Action(s) |
|---|---|---|---|
| 1 | Φ | None | None | G.Insert(1) |
| 2 | {1} | (1, 2) | None | G.Insert(2) |
| 3 | {1, 2} | (2, 3) | 3 | delete 3 |
| 4 | {1, 2} | None | None | G.Insert(4) |
| 5 | {1, 2, 4} | (4, 5) | None | G.Insert(5) |
| 6 | {1, 2, 5, 4} | (5, 6) | None | |
| | | (4, 6) | None | G.Insert(6) |
| 7 | {1, 2, 6, 5, 4} | (6, 7) | 7 | delete 7 |

TABLE 3-continued

| Current Solution G | | Compare Pair | Sub-Optimal Solution | Action(s) |
|---|---|---|---|---|
| 8 | {1, 2, 6, 5, 4} | (6, 8) | None | |
| | | (5, 8) | 8 | delete 8 |
| 9 | {1, 2, 6, 5, 4} | None | None | G.Insert(9) |
| 10 | {1, 2, 6, 5, 4, 9} | None | None | G.Insert(10) |
| 11 | {1, 2, 6, 5, 4, 9, 10} | (9, 11) | None | |
| | | (10, 11) | None | G.Insert(11) |
| 12 | {1, 2, 6, 5, 4, 11, 9, 12, 10} | (10, 12) | None | G.Insert(12) |
| 13 | {1, 2, 6, 5, 4, 11, 9, 12, 10} | None | None | G.Insert(13) |
| 14 | {1, 2, 6, 5, 4, 11, 9, 12, 10, 13} | (9, 14) | 14 | delete 14 |
| 15 | {1, 2, 6, 5, 4, 11, 9, 12, 10, 13} | (10, 15) | 15 | delete 15 |

The set S after pruning is S={1, 2, 4, 5, 6, 9, 10, 11, 12, 13} which is same as the set G.

It is should be appreciated that a new solution s with $q_w = q_{ws}$ is compared with solutions in a subset (called the "comparison" set) $G_w$ of G. The value of $q_w$ for each solution in the set $G_w$ is greater than or equal to $q_{ws}$. The comparison set can be reduced in size by having a second list H, where H=G, except that the solutions in H are sorted in ascending orders of $q_b$. A subset $H_b$ of H can be constructed for which $q_b$ values are less than or equal to $q_{bs}$. The set K produced by the intersection of $G_w$ and $H_b$ is the required comparison set. The solutions need to be compared with each of the solutions in K or until the solution s is found to be sub-optimal.

For example, with reference to TABLE 3, for p=8, G={1, 2, 6, 5, 4} and $G_w$={6, 5, 4}. H={1, 2, 4, 5, 6} and $H_b$={1, 2, 5}. Intersection of $G_w$ and $H_b$ provides the set K={5}, and, thus, the only pair needing comparison is (5,8). The comparison set can be further reduced by ordering solutions in K in ascending order of $c_w$. The subset $K_w$, for which $c_w$ is less than or equal to $c_{ws}$, needs to be considered. Again, the solutions in set K can also be arranged in ascending order of $d_b$ in a second list M. The subset $M_b$ of M for which $c_b$ is greater than or equal to $d_{bs}$ can be identified. The intersection of the sets $K_w$ and $M_b$ then is the smallest comparison set.

Solutions at the driver are inspected to see if more than one solution meets the early-mode timing requirement. If $q_b$ of a solution is less than $q_{bd}$, the solution satisfies the early-mode constraint, otherwise the solution does not satisfy the early mode constraint. In case of multiple feasible (in early-mode timing) solutions, the solution with the highest $q_w$ will be selected as the optimal solution. If no feasible solution exists, most likely there is not a sufficient number of candidate locations. If desired, it may be possible to select the solution that has the smallest violation in early-mode timing requirement.

It should be appreciated that since the timing requirement in the early mode is taken as a constraint, meeting the constraint requires accurate timing estimation. Usually, timing is highly sensitive to input slew. In one embodiment a lower bound of the timing delay (corresponding to the minimum expected input slew) in the early mode is computed. For the bottom-up traversal, the complete buffer tree in a net is not known until the driver is reached in the bottom-up traversal. Since the slew is not known within intermediate positions in a net before a repeater insertion, and a subsequent timing is completed, accurate delay computation during the bottom-up traversal is addressed below.

Current IC designs typically dictate both an upper bound (a max) and a lower bound (a min) on the slew requirements. A lower bound on slew is helpful to avoid too fast signals in the design, thereby avoiding excessive power dissipation. A lower bound on slew also alleviates fast path problems and excessive noise. The bounds on slew can be met during repeater insertion by backward propagation of max and min slew requirements from the sinks to upstream nodes in the net during the bottom-up traversal. The backward propagation of min slew provides an additional mechanism to compute a lower bound on early-mode delays for the partial solutions being generated. In one embodiment, delays in the interconnects and gates are computed at the min slews being propagated backward.

Referring back to FIG. 9, let the min slew requirements at node 1 and node 2 are m1 and m2, respectively. For a choice of a repeater at node 3, the value of min slew m3 is computed such that the computed slew m3 does not violate the min slew requirements at node 1 and node 2. It should be appreciated that the delay values computed at m3 also provides a lower bound for the early mode delay in the downstream network rooted at node 3. For example, let the min slew requirements at node 1 and node 2 be 50 ps and 60 ps, respectively. The computed slew requirement at node 3 is 30 ps. The delay computed in the network in this exemplary embodiment using FIG. 9 at the input slew of 30 ps at node 3 will provide the necessary lower bound to the early-mode delays.

Consider that the requirement is that the min slew should be at least 40 ps at any node in the network. In this scenario, the early-mode delays cannot use an estimate of the input slew of 30 ps. Instead, the delays with an input slew of 40 ps are computed. However, at 40 ps of input slew at node 3, the computed slew at node 1 may be more than 50 ps, e.g., assume the new value is 55 ps. Similarly, the computed slew at node 2 may be more than 60 ps (assume the new value is 65 ps). In this scenario, the early mode delays that are previously computed at node 1 with an input slew value of 50 ps are no longer valid. Here, the early-mode delays are recomputed at nodes of the network downstream to node 1 at the new value 55 ps for input slew at node 1. The process needs to be repeated, recursively, for the downstream nodes, until the min-slew values previously computed are not changed beyond certain limits. Similar re-computation of delays at node 2 is needed with the new slew value of 65 ps at node 2. However, it should be appreciated that recomputation of delay values at min slew is not a must. Old delay values will be lower than the delay values if computed a new. Thus, the old delay values provide a lower bound, and therefore, satisfies the min-time requirements pessimistically. Recomputing delay values provides better accuracy for added run time. In essence there is a trade off between accuracy and speed here. Part of the accurate delay estimation in the early mode requires that the hold time of the destination latch be computed with respect to the min slew propagated/assumed at the sink representing a latch/flop.

Run time, as well as memory requirements, increases with the number of candidate locations Nc. Nc should be sufficient to allow satisfying (i) the max slew requirement, (ii) allow path isolation for meeting hold-time violation, (iii) allow path isolation for minimizing the critical delay in the late-mode timing, and (iv) load balancing in nets where skew of sink arrival times need to be minimized. Higher value of Nc provides more quality solutions at the expense of run time. However, the quality (in terms of the minimum late-mode critical delay) may become almost "flat" beyond certain value of Nc. Therefore, in one embodiment, Nc should be reduced as much as possible subject to satisfying all above requirements.

Traditional bottom-up methods can be followed for locating candidates. These bottom-up methods start at the sink(s) and traverse up the resistance/capacitance (RC) network. During traversing up, measures of the above conditions are computed. A candidate location is inserted as soon as any one of the above conditions may be violated. Once a candidate location is inserted, the values of these measures are reset to zero.

In one embodiment, a pessimistic, but quick slew computation method to make sure that the condition (i) is satisfied. Input slew can be assumed to be the max slew. Additionally, the load at the downstream candidate location can be assumed to correspond to the biggest size repeater. The drive strength driving the RC network of interest can be assumed to correspond to the smallest repeater. FIG. 15 is a simplified schematic illustrating the location of candidates and the assumption of the max slew during the bottom-up traversal in accordance with one embodiment of the invention. Three candidate locations 160, 162, and 164 are located between sink 166 and driver 168. The load for each downstream candidate is assumed to correspond to the largest size repeater, while the drive strength is assumed to correspond to the smallest size repeater. The actual drive strength of the driver can be used when locating candidates close to the driver.

Figure 16:
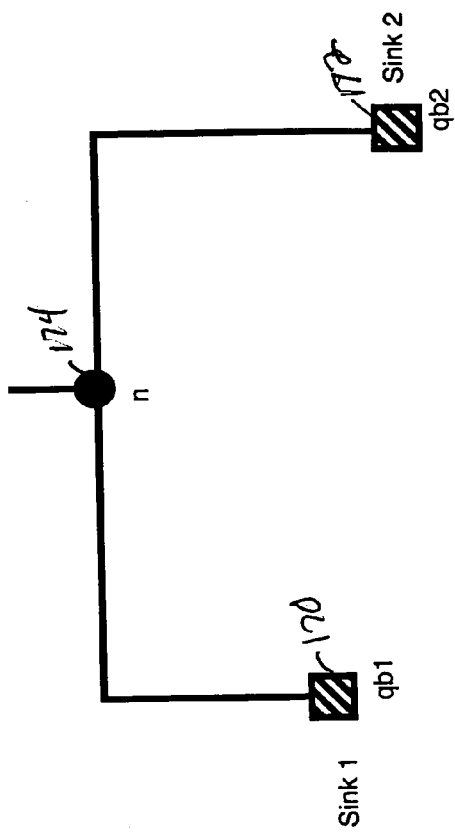
FIG. 16 is a simplified schematic diagram used to illustrate an exemplary methodology for inserting a minimum number of candidate locations into the net in accordance with one embodiment of the invention.

FIG. 16 is a simplified schematic diagram used to illustrate an exemplary methodology for inserting a minimum number of candidate locations into the net in accordance with one embodiment of the invention. Consider the two sinks 170, and 172 with required arrival time of $q_{b1}$ and $q_{b2}$ as shown in FIG. 16. The two sinks are connected to a common node n 174 via RC segments. The difference $q_{b1}-q_{b2}$ plays a role in determining the difference between the number of candidate locations from n to sink 1 ($N_{c1}$) and the number of candidate locations from n to sink 2 ($N_{c2}$), respectively. Let the early-mode delay for a repeater be $d_r$. Then:

$$(N_{c1}-N_{c2}) > (q_{b1}-q_{b2})/d_r \tag{1}$$

To be on the safe side, $d_r$ can be assumed to be the delay for the biggest repeater with the smallest delay. It should be appreciated that a relationship similar to Equation (1) can be derived for the late-mode required arrival times.

Note that if $q_{b1}$ and $q_{b2}$ are close to each other, $N_{c1}$ and $N_{c2}$ can be the same and the number of candidates may be determined based on other criteria such as satisfying the max slew requirement. For the case where the RC loading at the node n 174 for the downstream RC tree is small, $N_{c1}$ and $N_{c2}$ can both be zero. Thus, locating candidate locations at every branch point can be avoided.

In order to ensure that there are enough candidate locations so as not to degrade the quality of solution, and to satisfy balancing loads driven by various repeaters, a maximum RC delay may be used as the upper bound for the loading at any candidate location. It should be appreciate that following the above rules will result in inserting a minimum number of candidate locations needed and thus, will tend to minimize the run time.

Figure 17:
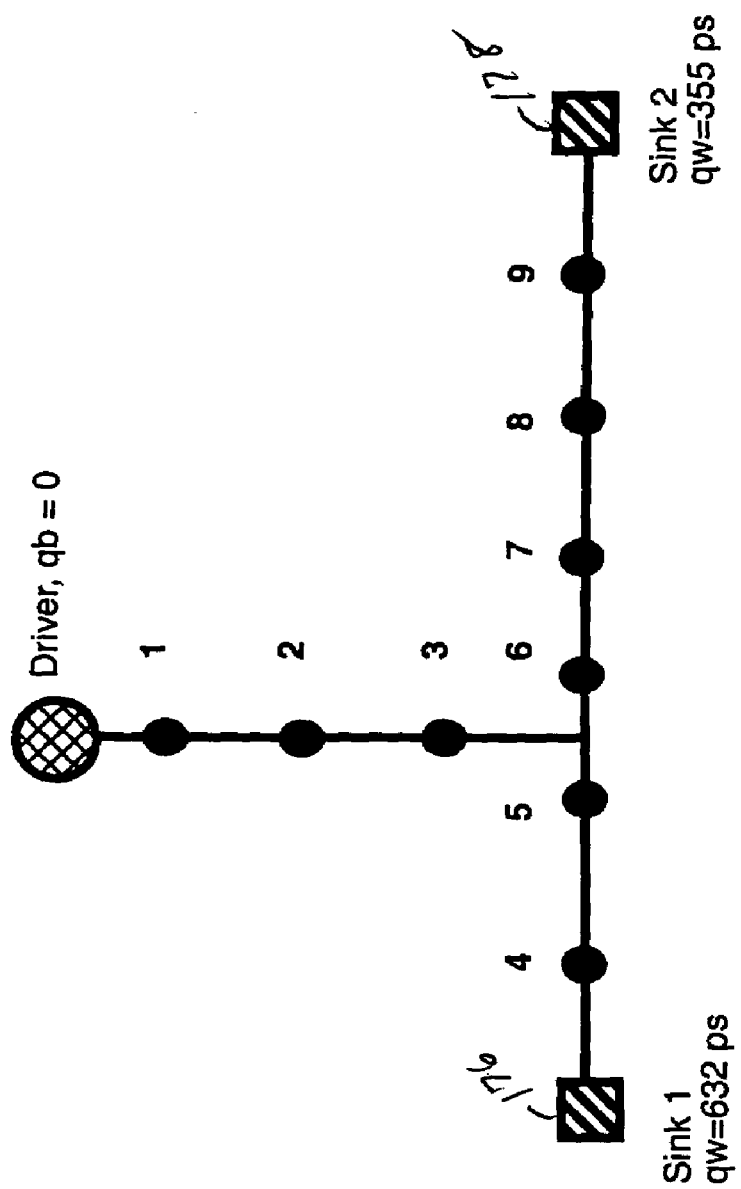
FIG. 17 is a simplified schematic illustrating a two-sink net with late-mode required arrival times at the two sinks and the candidate locations on the RC network in accordance with one embodiment of the invention.

FIG. 17 is a simplified schematic illustrating a two-sink net with late-mode required arrival times at the two sinks and the candidate locations on the RC network in accordance with one embodiment of the invention. Table 4 shows the impact of early-mode arrival times $q_{b1}$ and $q_{b2}$ at sink 1 176 and sink 2 178, respectively, on the repeater solution and the late-mode arrival time at the input of the driver ($q_{dw}$). Negative values of $q_{db}$ indicate that the early-mode constraints are satisfied.

TABLE 4

Early-Mode Required Arrival time vs. Repeater Solution

| $q_{b1}$ (ps) | $q_{b2}$ (ps) | Repeater at Location(s) | $q_{dw}$ (ps) | $q_{db}$ (ps) |
|---|---|---|---|---|
| 150 | 150 | 6x at 3, 5, and 8 | 78 | −16 |
| 107 | 71 | 0 | 136 | −2 |
| 118 | 78 | 6x at 5 | 150 | −10 |
| 158 | 89 | 6x at 4 and 5 | 150 | −6 |
| 190 | 107 | 6x at 2, 3, 4, 5, and 8 | 52 | −10 |

Repeater insertion was performed at minimum area mode, i.e., a repeater was used either for satisfying slew or early-mode constraint and not to optimize the late-mode delay. Thus, although $q_{dw}$ was higher for the third solution due to the use of the 6x repeater at location 5, it was not used in the second solution because an additional repeater was not needed to satisfy the early-mode timing requirement. As $q_{b1}$ is increased for the fourth case, two repeaters are used for sink 1 (at locations 4 and 5). When a 6x is used at location 3, another 6x at location 8 was needed since otherwise, slew requirements could not be met. This behavior is demonstrated by the first and the fifth solutions corresponding to rows 1 and 5 of TABLE 4.

Figure 18:
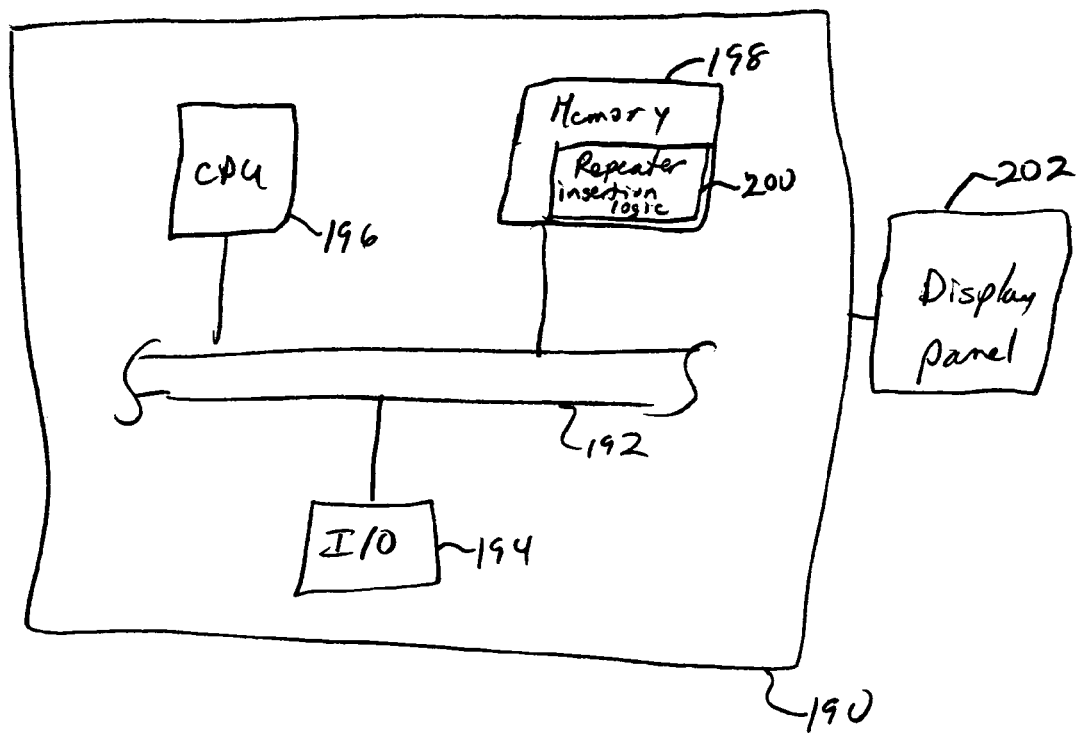
FIG. 18 is a simplified schematic diagram of a system for inserting repeaters when designing an integrated circuit in accordance with one embodiment of the invention.

FIG. 18 is a simplified schematic diagram of a system for inserting repeaters when designing an integrated circuit in accordance with one embodiment of the invention. System 190 includes central processing unit (CPU) 196, memory 198, and input/output (I/O) block 194. CPU 196, memory 198, and I/O block 194 are in communication with each other over bus 192. Memory 198 includes repeater insertion logic 200. Repeater insertion logic 200 provides program instructions that when executed by CPU 196 causes the functionality as described above to insert repeaters into an integrated circuit design while concurrently considering the early mode and the late mode timing requirements. That is, both the set up time and the hold time parameters are considered by the repeater insertion logic. One skilled in the art will appreciate that repeater insertion logic 200 may be software, hardware or some combination of the both. System 190 includes display panel 192 for providing a graphical user interface to a user.

In summary, a method for inserting repeaters where setup and hold time violations are concurrently considered is provided. A set of candidate locations along an RC segment of an RC network is identified as discussed with reference to FIGS. 15 and 16. These candidate locations are then ordered for bottom-up traversal of the RC segment. At each candidate location partial solutions are generated. While generating these solutions, sub-optimal solutions are avoided as discussed with reference to FIGS. 11-14. These resulting solutions are inserted into two lists, one sorted in ascending order of $c_w$, and the other sorted in ascending order of $c_b$. For each candidate location the partial solutions are further pruned according to the rules listed in TABLE 1. In one embodiment, the method assumes a pessimistic view of the slew in order to efficiently generate the repeater insertion locations, however, the slew may be more accurately calculated once the driver is reached on the bottom-up traversal.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data that can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for inserting repeaters into an integrated circuit synthesis comprising method operations of:
    identifying possible repeater insertion locations along a signal routing pathway within an integrated circuit design;
    organizing the possible repeater insertion locations in a tree enabling bottom-up traversal;
    generating a set of solutions for each of the insertion locations while traversing the tree in a first direction, considering both set up time and hold time concurrently when generating the set of solutions, identifying solutions that are non sub-optimal in a late mode and solution that are non sub-optimal in an early mode, identifying combinations of solutions that are non sub-optimal in the late mode and combinations of solutions that are non sub-optimal in the early mode, identifying combinations common to both combinations of solutions and eliminating the combinations common to both combinations of solutions; and
    organizing the set of solutions in a first and a second set, the first set ordered by a late mode capacitive load and the second set order by an early mode capacitive load.

2. The method of claim 1, wherein the method operation of organizing the set of solutions in a first and a second set, the first set ordered by a late mode capacitive load and the second set order by an early mode capacitive load includes,
    discarding solutions from one of the first set and the second set according to rules.

3. The method of claim 2, wherein the rules are based on a relationship between a required arrival time in an early mode and a required arrival time in a late mode.

4. The method of claim 1, wherein the signal routing pathway defines a pathway between a driver and a destination.

5. The method of claim 1, wherein the method operation of generating a set of solutions for each of the insertion locations while traversing the tree in a first direction includes,
    computing a worst case slew requirement at each candidate location for a late mode; and,
    computing a best case slew requirement at each candidate location for an early mode.

6. The method of claim 5, further comprising:
    recomputing the slew requirement at each candidate location after reaching a top of the tree and determining a slew requirement for a driver of the signal routing pathway.

7. The method of claim 1, wherein the first direction is from a destination of the signal routing pathway to a driver of the signal routing pathway.

8. A computer readable medium having program instructions for inserting repeaters into an integrated circuit synthesis comprising:
    program instructions for identifying possible repeater insertion locations along a signal routing pathway within an integrated circuit design;
    program instructions for organizing the possible repeater insertion locations in a tree enabling bottom-up traversal;
    program instructions for generating a set of solutions for each of the insertion locations while traversing the tree in a first direction, considering both set up time and hold time concurrently when generating the set of solutions, identifying solutions that are non sub-optimal in a late mode and solution that are non sub-optimal in an early mode, identifying combinations of solutions that are non sub-optimal in the late mode and combinations of solutions that are non sub-optimal in the early mode, identifying combinations common to both combinations of solutions and eliminating the combinations common to both combinations of solutions; and
    program instructions for organizing the set of solutions in a first and a second set, the first set ordered by a late mode capacitive load and the second set order by an early mode capacitive load.

9. The computer readable medium of claim 8, wherein the program instructions for organizing the set of solutions in a first and a second set, the first set ordered by a late mode capacitive load and the second set order by an early mode capacitive load includes,
    program instructions for discarding solutions from one of the first set and the second set according to rules.

10. The computer readable medium of claim 9, wherein the rules are based on a relationship between a required arrival time in an early mode and a required arrival time in a late mode.

11. The computer readable medium of claim 8, wherein the signal routing pathway defines a pathway between a driver and a destination.

12. The computer readable medium of claim 8, wherein the program instructions for generating a set of solutions for each of the insertion locations while traversing the tree in a first direction includes,
    program instructions for designating a worst case for a slew requirement at each candidate location.

13. The computer readable medium of claim 12, further comprising:
  program instructions for recomputing the slew requirement at each candidate location after reaching a top of the tree and determining a slew requirement for a driver of the signal routing pathway.

14. The computer readable medium of claim 8, wherein the first direction is from a destination of the signal routing pathway to a driver of the signal routing pathway.

15. A system for designing an integrated circuit, the system comprising:
  a bus;
  a memory;
  a monitor configured to display a design of the integrated circuit;
  a processor in communication with the memory and the monitor through the bus, the processor operable to receive instructions which, when executed by the processor, cause the processor to perform a method operations comprising:
    identifying possible repeater insertion locations along a signal routing pathway within an integrated circuit design;
    organizing the possible repeater insertion locations in a tree enabling bottom-up traversal;
    generating a set of solutions for each of the insertion locations while traversing the tree in a first direction and both a set up time and a hold time are considered concurrently when generating the set of solutions, identifying solutions that are non sub-optimal in a late mode and solution that are non sub-optimal in an early mode, identifying combinations of solutions that are non sub-optimal in the late mode and combinations of solutions that are non sub-optimal in the early mode, identifying combinations common to both combinations of solutions and eliminating the combinations common to both combinations of solutions; and
    organizing the set of solutions in a first and a second set, the first set ordered by a late mode capacitive load and the second set order by an early mode capacitive load.

16. The system of claim 15 wherein the first direction is from a destination of the signal routing pathway to a driver of the signal routing pathway.

17. A method for inserting repeaters into an integrated circuit synthesis comprising method operations of:
  identifying possible repeater insertion locations along a signal routing pathway within an integrated circuit design;
  organizing the possible repeater insertion locations in a tree enabling bottom-up traversal;
  generating a set of solutions for each of the insertion locations while traversing the tree in a bottom-up direction;
  organizing non sub-optimal solutions in multiple sets, the multiple sets being ordered by one of a late mode capacitive load or an early mode capacitive load;
  identifying an intersection of the multiple sets; and
  comparing solutions in the intersection with a solution of the generated set of solutions.

18. The method of claim 17, wherein the method operation of comparing the intersection with a solution of the generated set of solutions includes,
  identifying if the solution is sub-optimal in order to discard the solution to obtain a minimum set non-suboptimal solution.

19. The method of claim 18, wherein the method operation of identifying if the solution is sub-optimal in order to discard the solution to obtain a minimum set of solutions includes,
  determining a relationship between early mode required arrival times of corresponding solutions; and
  determining a relationship between early mode capacitive loading of corresponding solutions.

20. The method of claim 19, further comprising:
  determining a relationship between late mode required arrival times of corresponding solutions.

21. The method of claim 19, further comprising:
  determining a relationship between late mode capacitive loading of corresponding solutions.

* * * * *